United States Patent [19]

Bruder

[11] Patent Number: 5,337,000
[45] Date of Patent: Aug. 9, 1994

[54] METHOD FOR FAST IMAGING IN NUCLEAR MAGNETIC RESONANCE TOMOGRAPHY

[75] Inventor: Herbert Bruder, Hoechstadt, Fed. Rep. of Germany

[73] Assignee: Siemens Aktiengesellschaft, Munich, Fed. Rep. of Germany

[21] Appl. No.: 78,107

[22] Filed: Jun. 18, 1993

[30] Foreign Application Priority Data

Jul. 3, 1992 [EP] European Pat. Off. ........ 92111274.4

[51] Int. Cl.$^5$ ............................................. G01V 3/00
[52] U.S. Cl. .................................... 324/309; 324/307
[58] Field of Search ................ 324/300, 307, 308, 309, 324/311

[56] References Cited

U.S. PATENT DOCUMENTS

| | | | |
|---|---|---|---|
| 4,707,658 | 11/1987 | Frahm et al. | 324/309 |
| 4,769,603 | 9/1988 | Oppelt et al. | 324/309 |
| 4,794,337 | 12/1988 | Twieg | 324/309 |
| 4,808,928 | 2/1989 | Frahm et al. | 324/309 |
| 4,868,502 | 9/1989 | Hanakawa et al. | 324/307 |
| 4,901,020 | 2/1990 | Ladebeck et al. | 324/309 |
| 4,973,906 | 11/1990 | Bernstein | 324/309 |
| 5,162,730 | 11/1992 | Schmitt et al. | 324/309 |

FOREIGN PATENT DOCUMENTS

| | | |
|---|---|---|
| 0076054 | 4/1983 | European Pat. Off. . |
| 0349976 | 1/1990 | European Pat. Off. . |
| 0414318 | 2/1991 | European Pat. Off. . |
| 0490528 | 6/1992 | European Pat. Off. . |

OTHER PUBLICATIONS

"Cartesian Echo Planar Hybrid Scanning with Two to Eight Echoes," Kashmar et al., IEEE Trans. on Med. Imag., vol. 10, No. 1 (Mar. 1991) pp. 1–10.

*Primary Examiner*—Louis Arana
*Attorney, Agent, or Firm*—Hill, Steadman & Simpson

[57] ABSTRACT

An examination subject is subjected to radio-frequency pulses with a repetition time that is shorter than the spin lattice relaxation time of the nuclear spins under consideration. After each radio-frequency pulse, a plurality of echoes are acquired by a read-out gradient that multiply changes in polarity. Given this sequence, images can be acquired in fractions of a second despite long repetition times without special hardware being required.

11 Claims, 4 Drawing Sheets

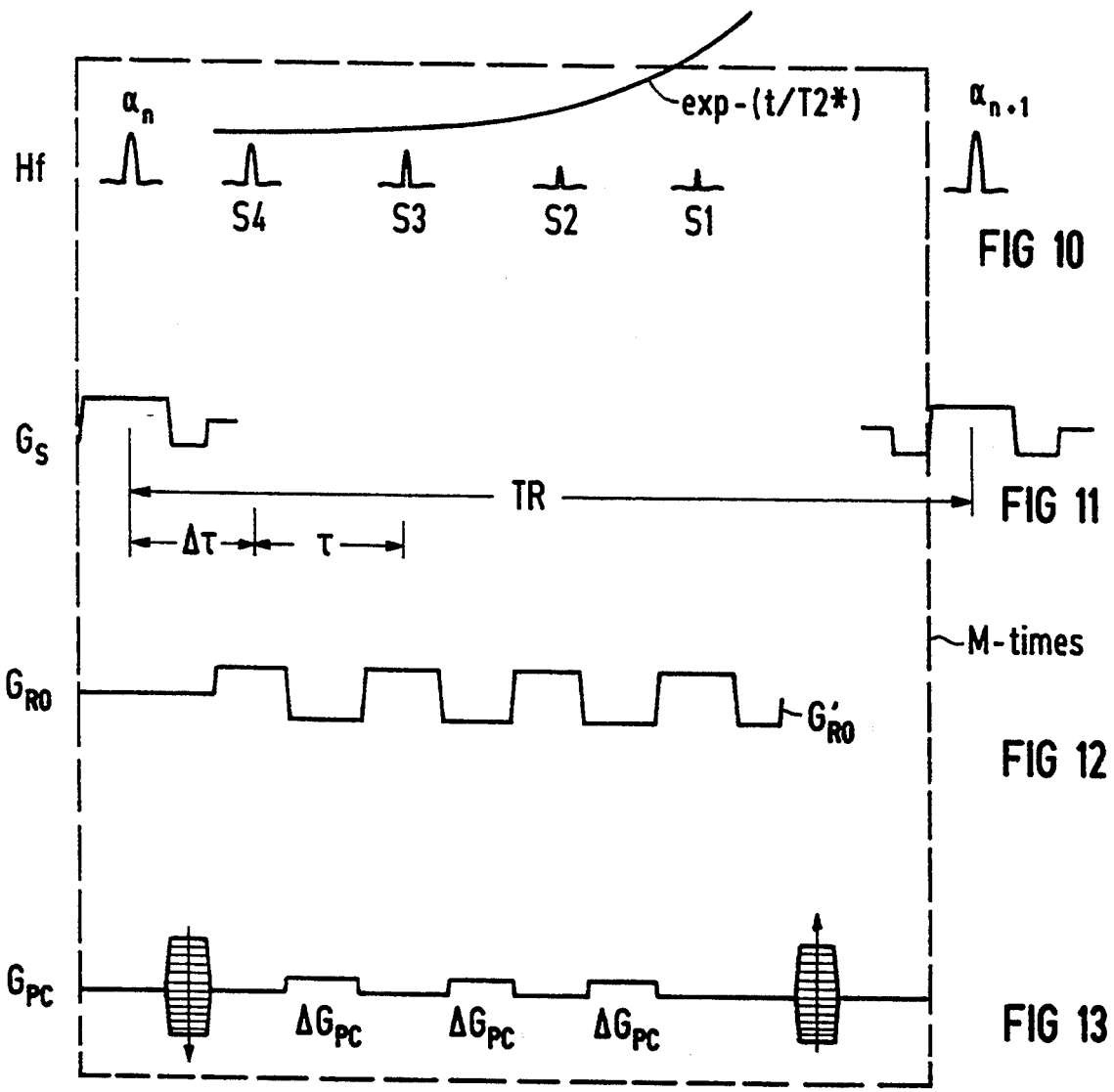

METHOD FOR FAST IMAGING IN NUCLEAR MAGNETIC RESONANCE TOMOGRAPHY

BACKGROUND OF THE INVENTION

1. Field of the Invention

The present invention is directed to a method for operating a nuclear magnetic resonance imaging (tomography) apparatus, and in particular to a method employing the generation of a pulse sequence for fast imaging.

2. Description of the Prior Art

Three methods for fast imaging are known in nuclear magnetic resonance tomography, namely the FLASH method, the FISP method and echo planar method, each having various versions.

For example, U.S. Pat. No. 4,707,658 discloses the FLASH method, wherein gradient echoes with small flip angles of the radio-frequency pulse and repetition times that are significantly shorter than the spin-grid relaxation times of the nuclear spins to be investigated are generated. In this known method, as the flip angles are selected smaller, the shorter the repetition times become, i.e., the faster the pulse sequence becomes. The signal-to-noise ratio also decreases with the diminution of the flip angle.

In an especially fast version of the FLASH method, having extremely short repetition times, referred to as the turbo-FLASH method, the magnetization is inverted before every measurement sequence in order to prevent the T1 contrast from collapsing. Due to the necessary spin inversion, however, one must wait for the establishment of an equilibrium of the spins for every new measurement sequence. Continuous measurement in dynamic equilibrium is therefore not possible.

The FISP method, which is disclosed in detail in U.S. Pat. No. 4,769,603, likewise represents a fast gradient echo method wherein, differing from the FLASH method, the phase coding is reset before every radio-frequency pulse.

The method known as the echo planar method, as disclosed in European Application 0 076 054 is even faster than the FLASH method or FISP method. At the beginning of the pulse sequence, an examination subject is subject to an RF excitation pulse under the influence of a slice selection gradient in a first direction. Nuclear spins are thus excited in a slice of the examination subject. After the excitation, a pulse-coding gradient is activated in a second direction and a read-out gradient is activated in a third direction, the first, second and third directions being perpendicular relative to one another. The read-out gradient is composed of a pre-phasing pulse as well as of sub-pulses of alternating polarity. As a result of this alternating polarity of the read-out gradient, the nuclear spins are dephased and in turn rephased in alternation, so that a sequence of nuclear magnetic resonance signals arises. So many signals are thereby acquired after a single excitation that the entire Fourier k-space is scanned, i.e. that the existing data are adequate for the reconstruction of a complete tomogram.

The nuclear magnetic resonance signals are phase coded, sampled in the time domain, digitized, and the numerical values acquired in this way are entered into a raw data matrix. An image of the examination subject is then reconstructed from this raw data matrix on the basis of a two-dimensional Fourier transformation.

The speed advantage of the EPI method is essentially based on the fact that a plurality of signals that are adequate for the reconstruction of a complete tomogram are acquired after an individual excitation. All signals that ultimately represent gradient echoes must be acquired within the T2* decay. The read-out gradient must therefore be very rapidly bipolarly switched, so that considerable hardware demands are made of a corresponding system.

SUMMARY OF THE INVENTION

It is an object of the present invention to provide a method for operating a magnetic resonance imaging apparatus in the form of a pulse sequence, such that a good signal-to-noise ratio is achieved given a short measuring time, and wherein the technological demands remain lower in comparison to the EPI method.

The above object is achieved in accordance with the principles of the present invention in a method for operating a magnetic resonance imaging apparatus, in the form of a pulse sequence, wherein an examination subject disposed in a uniform magnetic field is exposed to a pulse sequence starting with a radio-frequency pulse having a flip angle of less than 90°, after which a read-out gradient is generated having a plurality of subpulses of alternating polarity. A nuclear magnetic resonance signal arises after each subpulse, and at least a portion of the nuclear magnetic resonance signals is read out. A phase-coding gradient, in a direction perpendicular to the direction of the read-out gradient, is generated before each read-out gradient, so that the nuclear magnetic resonance signals are respectively impressed with different phase information (phase coded). The above steps are repeated M times with the same flip angle, with the spacing between successive radio-frequency pulses being constant and being shorter than the spin lattice relaxation time. An image is then reconstructed from the read-out signals.

A continuous acquisition of data sets in dynamic equilibrium is thus possible using the inventive method. This is in contrast, for example, to the aforementioned turbo-FLASH method, wherein a new spin inversion must ensue for each exposure, and therefore after each exposure one must wait for the system to regain equilibrium. A significantly faster read-out time can thus be achieved compared to known pulse sequences, or alternatively, if the inventive pulse sequence is employed over the same measuring time as a conventional sequence, because the repetition time TR is longer in the inventive method, larger excitation angles for the radio-frequency pulses can be selected so that a better signal-to-noise ratio is obtained.

In a further embodiment of the invention, a slice-selection gradient can be generated with each radio-frequency pulse, the slice-selection gradient being perpendicular to the read-out gradient and to the phase-coding gradient, and the dephasing caused by the slice-selection gradient is then compensated by a rephasing gradient.

The phase-coding gradient can be activated during the sub-pulses of the read-out gradient having a first polarity, and the arising nuclear magnetic resonance signals can the be read out during the sub-pulses of the read-out gradient having a second polarity.

A further gradient can be activated in the phase-coding direction before each radio-frequency pulse, so that the phase information in the phase-coding direction is reset by this gradient. Additionally, a pre-phasing pulse may be activated in the direction of the read-out gradient between each radio-frequency pulse and the first nuclear magnetic resonance signal following that radio-frequency pulse. The pre-phasing pulse can be activated in the read-out direction.

As is known, the nuclear magnetic resonance signals can then be sampled and digitized, and entered into rows of a measurement matrix, sorting according to the respective phase factor of each nuclear magnetic resonance signal. In accordance with the inventive method, the switching of the phase-coding gradient ensues so that chronologically successive nuclear magnetic resonance signals are arranged in neighboring rows of the measurement matrix. Moreover, the switching of the phase-coding gradient can ensue such that the individual nuclear magnetic resonance signals are divided into groups according to the sequence of their appearance after the respective radio-frequency pulses, the nuclear magnetic resonance signals of each group then being entered into successive rows of the measurement matrix. The group of signals having the highest amplitude is preferably entered into the middle rows of the measurement matrix, since this group has the biggest contribution to the formation of the image. Preferably the groups are arranged in the matrix so that adjacent groups of nuclear magnetic resonance signals differ as little as possible in amplitude. Moreover, the groups are preferably arranged in the measurement matrix so that a substantially symmetrical distribution of the amplitudes of the nuclear magnetic resonance signals, with respect to the middle row of the measurement matrix, is obtained.

DESCRIPTION OF THE DRAWINGS

FIGS. 10 through 13 show a second exemplary embodiment of the sequence of the invention.

DESCRIPTION OF THE PREFERRED EMBODIMENTS

Figure 1:
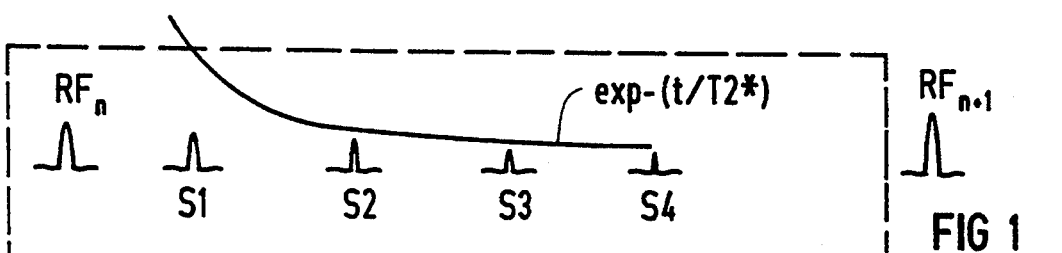
FIGS. 1 through 4 show a first exemplary embodiment of a pulse sequence of the inventive method.
Figure 2:
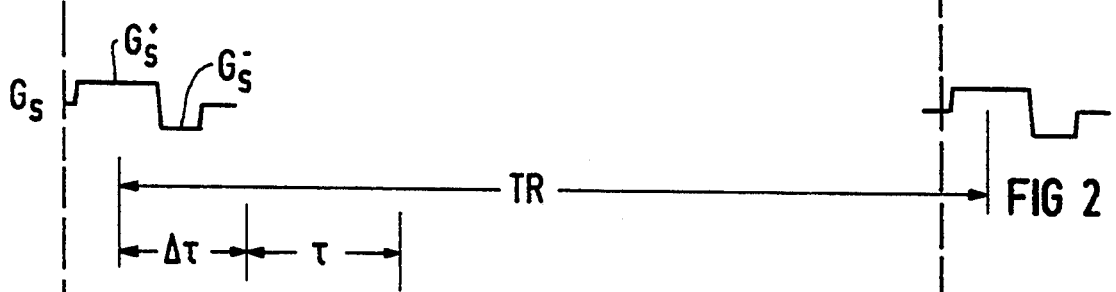
Figure 3:

A first exemplary embodiment of the invention shall be set forth below with reference to the pulse sequence of FIGS. 1 through 4. A selective radio-frequency pulse $RF_n$, to which an examination subject is subjected, is generated under the influence of a slice selection gradient $G_S^+$. Subsequently, the slice selection gradient $G_{S+}$ is inverted to form $G_S^+$ in order to in turn cancel the previous dephasing. Further, a negative pre-phasing gradient $G_{ROV_6}$ is activated in the read-out direction RO. Finally, the read-out gradient $G_{RO}$ is multiply inverted, whereby a nuclear magnetic resonance signal arises at every sub-pulse of the read-out gradient $G_{RO}$. As in the echo planar method set forth above, this is based on successive dephasing and rephasing events of the nuclear spins.

In the illustrated example, only the nuclear magnetic resonance signals S1 through S4 appearing under the positive sub-pulses of the read-out gradient $G_{RO}$ are read out. Phase-coding gradients $\Delta G_{PC}$ are activated during the negative sub-pulses of the read-out gradient $G_{RO}$; the structure of these phase-coding gradients $\Delta G_{PC}$ shall be discussed in detail below.

At a time interval TR (repetition time) relative to the radio-frequency pulse $RF_n$, a further radio-frequency pulse $RF_{n+1}$ follows, being in turn followed by the illustrated pulse sequence. The time interval TR is shorter than the spin lattice relaxation time. When the illustrated pulse sequence is implemented M times, then 4M nuclear resonance signals are ultimately available for evaluation. These nuclear magnetic resonance signals S are sampled in the conventional manner, are digitized, and the numerical values thereby acquired are entered into a row of a raw data matrix according to FIG. 7, sorted according to phase factors for every nuclear magnetic resonance signal S. The raw data matrix can be considered to be a measurement space, a measured data plane in the two-dimensional case of the exemplary embodiment. This measured data space is generally referred to as "k-space" in nuclear magnetic resonance tomography.

The information about the spatial origin of the signal contributions S necessary for the imaging is coded in the phase factors, whereby the relationship between the locus space (i.e., the image) and the k-space exists mathematically via a Fourier transformation, representable as follows:

$$S(K_x, K_y) = \int\int \zeta(x,y) e^{i(K_x x + K_y y)} dx dy.$$

The following definitions apply:
$K_x(t) = \gamma \int G_{RO}(t') dt'$,
$K_y(t) = \gamma \int G_{PC}(t') dt'$,
$\gamma$ = gyromagnetic ratio
$G_{RO}(t')$ = momentary value of the read-out gradient $G_{RO}$,
$G_{PC}(t')$ = momentary value of the phase-coding gradient $G_{PC}$, and
$\zeta(x,y)$ = spin density distribution In the raw data matrix shown in FIG. 7, each row corresponds to a single nuclear magnetic resonance signal S. Given step-by-step forwarding of the phase-coding gradient $G_{PC}$, the scanning in the k-space ensues in successive rows. At the beginning of every sub-sequence, a phase-coding gradient $G_{PC1}$, whose gradient amplitude rises continuously in steps from sub-sequence to sub-sequence, is activated before the first nuclear magnetic resonance signal $S_1$. The phase of the nuclear spins within the sequence is incremented in steps by adding a phase-coding gradient $\Delta G_{PC}$ before every further nuclear magnetic resonance signal S2 through S4, the incrementation being to such an extent that it corresponds to a row in the measured data matrix of FIG. 7.

Viewed over a plurality of sub-sequences, this leads to four successive nuclear magnetic resonance signals S1 through S4 being first entered into the four first rows of the measured data matrix. In the next sub-sequence, the phase of the nuclear spins is advanced by the gradient $G_{PC1}$ to such an extent that the next four nuclear magnetic resonance signals S1 through S4 are entered into the next four rows of the measured data matrix.

Figure 7:
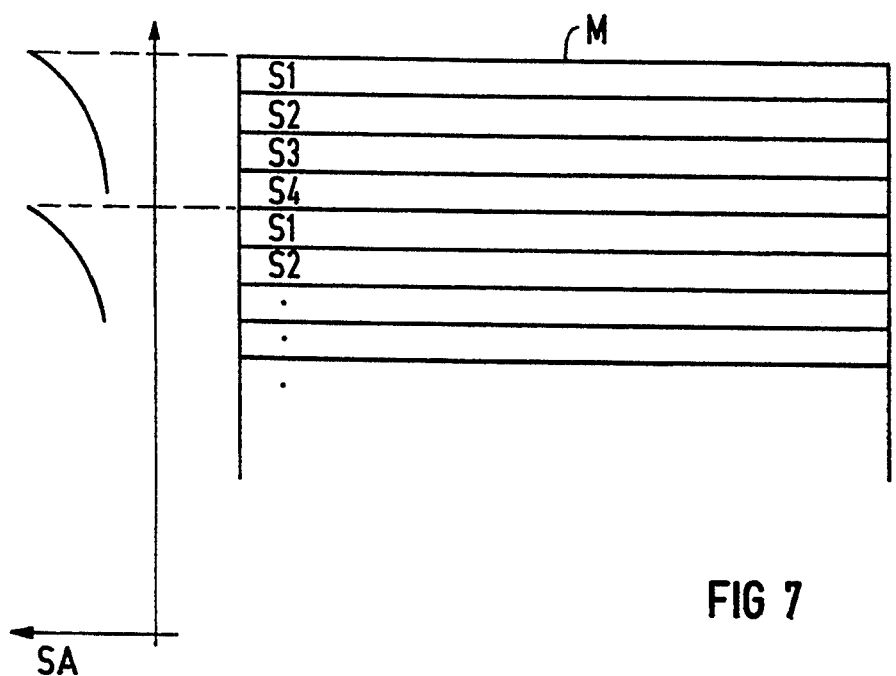
FIG. 7 shows a first alternative for ordering the nuclear magnetic resonance signals S in a raw data matrix M.

This method, however, has the following disadvantage. As indicated in FIG. 1, the amplitude of the nuclear magnetic resonance signals S1 through S4 decreases with the chronological distance t from the radio-frequency pulse according to the function exp(t/T2*). (t/T2*). T2* is the effective spin-spin relaxation time, i.e. the time constant with which a FID signal decays taking magnetic field inhomogeneities into consideration. In FIG. 7, the distribution of the T2*-dependent amplitude is schematically entered over the rows of the measured data matrix and is referenced SA. The amplitude curve thereby deriving over the rows of the measurement matrix can lead to image artifacts. This, however, can be essentially corrected by correcting the T2-dependency of the nuclear magnetic resonance signals. To that end, the nuclear magnetic resonance signal S is multiplied by the factor $$\exp[(l-1)\cdot\tau + \Delta\tau/T2], \text{ wherein}$$

$l = 1, 2, \ldots, L$ = number of the nuclear magnetic resonance signal within every subsequence, L = plurality of nuclear magnetic resonance signals per sub-sequence, and $\Delta\tau$ = chronological spacing between radio-frequency pulse $RF_n$ and the first nuclear magnetic resonance signal S.

This requires knowledge of the transverse relaxation time T2 of the examination subject, for example of the heart muscle.

When, due to basic field inhomogeneities, the effective relaxation time T2* is substantially shorter than the transverse relaxation time T2 prescribed by the examination subject, then the best correction factors can, if necessary, be calculated by iteration.

Figure 5:
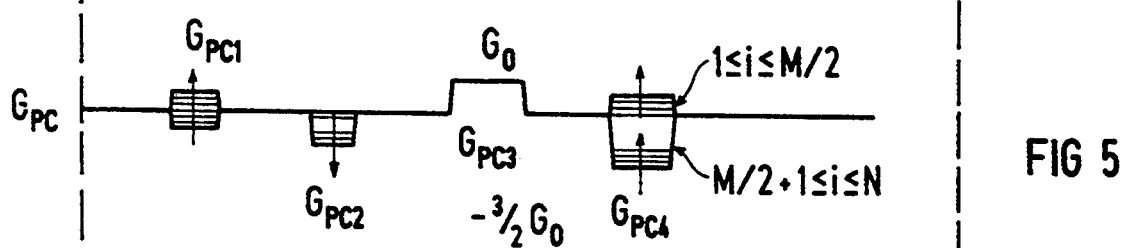
FIG. 5 shows a first, modified sequence for the phase-coding gradient $G_{PC}$.
Figure 8:
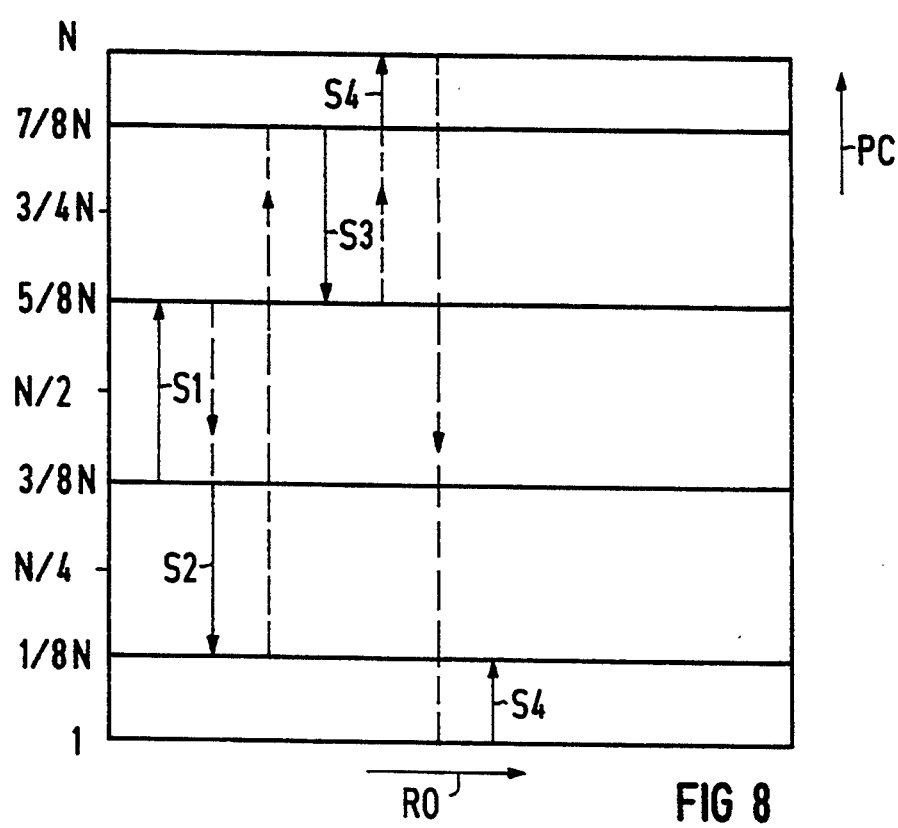
FIG. 8 shows a second alternative for ordering the nuclear magnetic resonance signals S in a raw data matrix M.

In a modification of the sequence of the phase-coding steps according to FIGS. 5 and 8, image artifacts due to the T2-dependency of the nuclear magnetic resonance signals can also be avoided without correction factors. To that end, the nuclear magnetic resonance signals are not only ordered into the measurement matrix in the sequence of their chronological appearance; rather, the respective first, second, third or fourth signals S1 through S4 are combined in groups in the sequence of their occurrence after the allocated radio-frequency signal $RF_n$. A first group thus contains the first signals S1 of every sub-sequence; a second group contains the second signals S2 of every subsequence, etc. The signals having the highest amplitude, i.e. the signals S1 combined to form the first group, are entered into the middle rows of the measurement matrix since these rows contribute most to the image. The weakest signals, i.e. the signals S4 of every sub-sequence combined to form the group 4, are correspondingly displaced to the edge rows of the measurement matrix.

FIG. 8 schematically shows how the nuclear magnetic resonance signals S1 through S4 are subsequently sorted into the rows of the measurement matrix having n rows. Due to the phase-coding gradient $G_{PC1}$ according to FIG. 5, the first signals S1 (first group) of every measurement sequence are phase coded such that all signals S1 symmetrically lie in a row region around the middle row N/2 after the end of the measured data registration.

Due to the second phase-coding gradient $G_{PC2}$ according to FIG. 5, which is advanced in the negative direction from sub-sequence to sub-sequence, the respectively second signals S2 (second group) are progressively sorted downwardly into a row region that extends from $\frac{3}{8}N$ through $\frac{5}{8}N$, whereby the signals S2 are sorted in from top to bottom according to their chronological sequence.

The respectively third signals S3 (third group), finally, are sorted, due to a constant phase-coding gradient $G_{PC3}$, such that they come to lie in a row region between $\frac{5}{8}N$ and $\frac{7}{8}N$, namely from top to bottom corresponding to their chronological sequence.

The respective fourth signals S4 (fourth group) are finally divided into two blocks in order to achieve an optimally far-extending symmetry of the amplitude curve with respect to the zero row. The first half of the signals S4 is sorted in the region of the rows $\frac{7}{8}N$ through N due to a phase-coding gradient $G_{PC4}$ advanced step-by-step in the positive direction from sub-sequence to sub-sequence, beginning from zero. When, thus, a total of M sub-sequences are measured (the index references the number of the subsequence), then the signals $S_{4i}$ for $1 \leq i \leq M/2$ are sorted into the rows $\frac{7}{8}N$ through N. The remaining signals S4, i.e. $S_{4i}$ for $M/2 + 1 \leq N$ are sorted in the lowest rows 1 through $\frac{1}{8}N$ of the measurement matrix. To that end, the phase-coding gradient $GF_{PC}$ is first switched in the negative direction for the nuclear magnetic resonance signal S4 according to FIG. 5 to be sorted into row 1 and the negative value is then varied in steps from sub-sequence to sub-sequence.

Figure 9:
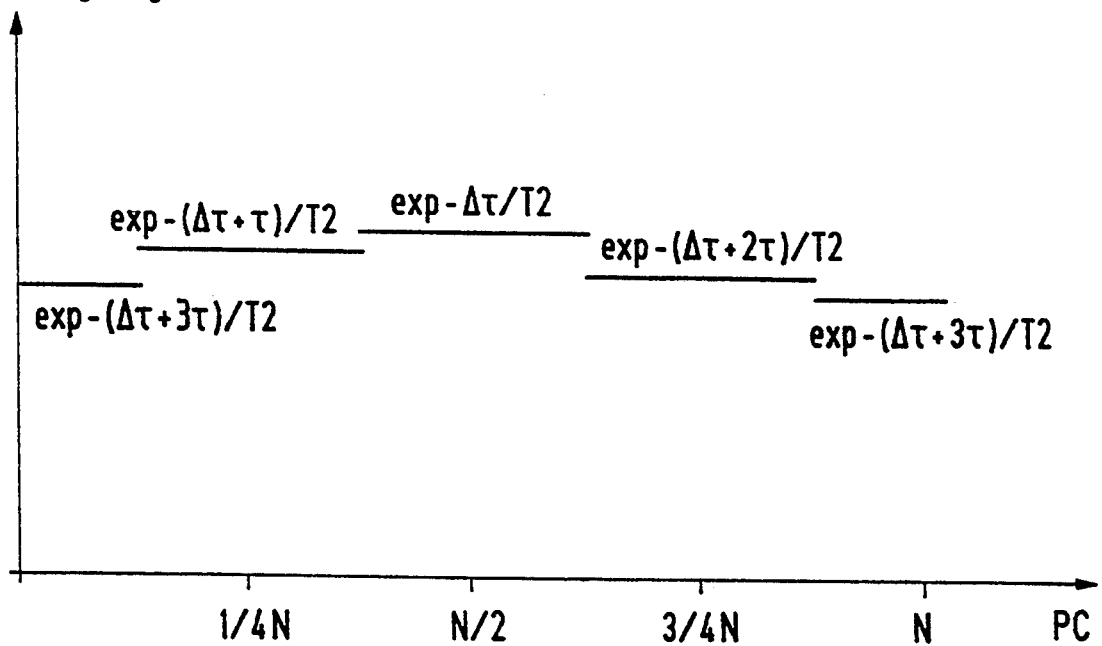
FIG. 9 shows the T2 weighting of the signals dependent on the row of the raw data matrix M.

As a result of this sorting of the nuclear magnetic resonance signals, the amplitude difference between neighboring rows of two neighboring groups is kept as slight as possible. An amplitude curve of the nuclear magnetic resonance signals dependent on the relaxation time T2 (i.e., a T2 weighting) according to FIG. 9 thus arises. As entered in FIG. 2, the spacing between the radio-frequency pulse RF and the first nuclear magnetic resonance signal S1 is referenced $\Delta\tau$ and the spacing between the individual nuclear magnetic resonance signals S1 through S4 is referenced $\tau$. The T2 weighting thus comprises a block structure with which artifacts due to the T2-dependency of the signals S1 through S4 can be avoided, in contrast to the exemplary embodiment of FIG. 7. The advancing of the phase coding according to FIG. 8 is defined such that optimally slight phase discontinuities occur from line-to-line. The maximum phase variation due to subject motions then corresponds to the repetition time TR. Further, one can see from FIG. 7 that the amplitude distribution of the nuclear magnetic resonance signals relative to the middle row is substantially symmetrical.

For relatively rapidly moving subjects, for example the heart, the phase variation in the exemplary embodiment of FIG. 8 could nonetheless lead to motion artifacts due to subject motions, and one could then have recourse to the exemplary embodiment of FIG. 7 with the application of correction factors. When the sequence timing therein is selected such that the chronological spacing between the last nuclear magnetic resonance signal $S_{4i}$ of a sub-sequence and the first nuclear magnetic resonance signal $S_{1(i+1)}$ of the following sub-sequence approximately corresponds to the spacing $\tau$ between two nuclear magnetic resonance signals during every sub-sequence, then a maximum phase variation corresponding to the chronological spacing $\tau$ arises from Fourier row to Fourier row. Movements will then have no greater disturbing influence on the image quality than is the case, for example, in the initially cited turbo-FLASH method.

A number of modifications are also possible with respect to the sub-sequences. According to FIG. 6, for example, the phase coding can thus be reset before every new radio-frequency pulse RF with a phase-coding gradient $G_{PC''5}$. This corresponds to the FISP sequence as disclosed in the initially cited U.S. Pat. No. 4,769,603.

Figure 4:
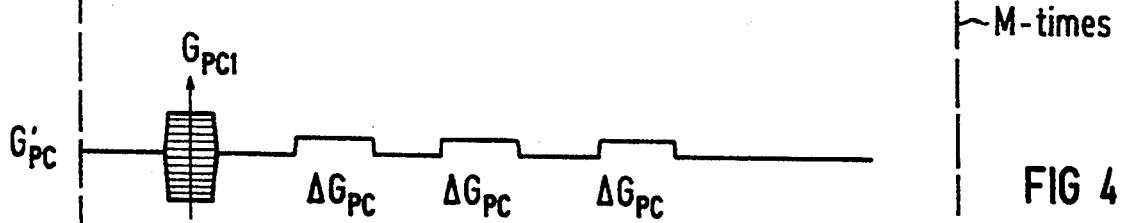
Figure 6:
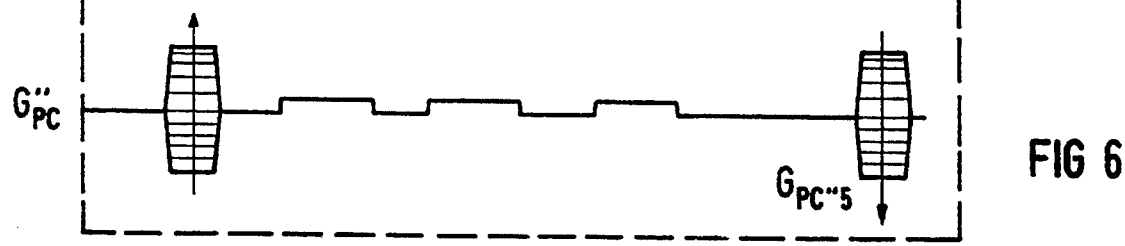
FIG. 6 shows a second modified sequence for the phase-coding gradient $G_{PC'}$.

Compared to the pulse sequence according to FIGS. 4 and 5 based on the FLASH sequence, the pulse sequence according to FIG. 6 based on the FISP sequence has the advantage that it exhibits a true T2 contrast that is especially diagnostically valuable. As shown in FIG. 6, the nuclear magnetic resonance signals are phase coded such that, according to FIG. 7, they are sorted into the rows of the measurement matrix in the sequence of their chronological occurrence. A phase coding according to FIG. 5 would, of course, be possible and this would lead to a sorting of the signals into the measurement matrix according to FIG. 8.

A further modification of the pulse sequence of the invention is shown in FIGS. 10 through 13. As presented in the article by H. Bruder et al., "A New Steady-State Imaging Sequence for Simultaneous Acquisition of Two MR Images with Clearly Different Contrasts", Magnetic Resonance in Medicine, 7, pages 35–42 (1988), a dynamic equilibrium can also be achieved by additionally reading out signals before every radio-frequency pulse in a sequence of radio-frequency pulses having a repetition time that is shorter than the spin lattice relaxation time; this pulse sequence is often referred to as "PSIF" sequence (inverting the expression "FISP"). According to FIG. 12, this is achieved by replacing the pre-phasing pulse $G_{ROV}$ according to FIG. 3 with a rephasing in the direction of the read-out gradient $G_{RO}$. The gradient pulse required for this purpose is referenced $G_{RO'}$ in FIG. 12. The echoes that are obtained are heavily T2 weighted. The echo S1 immediately preceding the radio-frequency pulse RF has the highest amplitude in this case and the amplitude curve is exactly mirror inverted relative to the sequence of FIG. 1 viewed chronologically. The read-out gradient $G_{RO}$ according to FIG. 12 remains unmodified- apart from the aforementioned pre-phasing pulse $G_{RO'}$. The sequence for the phase coding according to FIG. 13, which leads to a sorting of the nuclear magnetic resonance signals into the measurement matrix according to FIG. 8, is likewise mirror-inverted in comparison to FIG. 6.

Of course, it would also be possible to switch the phase-coding gradient according to FIG. 5, but mirror-inverted, and to sort the nuclear magnetic resonance signals into the measurement matrix according to FIG. 7.

The illustrated pulse sequence can, for example, be implemented with the following parameters:
repetition time TR=20 ms
number M of sub-sequences for a complete data set M=16
number of nuclear magnetic resonance signals per sub-sequence=4
width of a pulse of the read-out gradient $G_{RO}T/2=2$ ms.

A 128×64 image matrix can be measured in less than approximately 320 ms with such a sequence. Compared to turbo-FLASH sequences having the same measuring time, the repetition time TR is longer, so that larger excitation angles for the radio-frequency pulses can be selected. A better signal-to-noise ratio is thus obtained in the dynamic equilibrium.

A continuous acquisition of data sets in the dynamic equilibrium is possible using the inventive method, in contrast, a new spin inversion must ensue for every exposure given turbo-FLASH method and, therefore, one must first wait for the equilibrium to arise. By varying the number of sub-sequences applied for every data set and the repetition time TR per sub-sequence, the signal-to-noise ratio and the image contrast as well can be controlled in the inventive method. By contrast to the echo planar method that makes especially high hardware demands, the pulse sequence presented here can also be realized in conventional MR systems without hardware adaptations.

Although modifications and changes may be suggested by those skilled in the art, it is the intention of the inventor to embody within the patent warranted hereon all changes and modifications as reasonably and properly come within the scope of his contribution to the art.

I claim as my invention:

1. A method for operating a nuclear magnetic resonance tomography apparatus for the acquisition of nuclear magnetic resonance signals from an examination region of a subject, the subject containing nuclei having a prescribed spin lattice relaxation time, said method comprising the steps of:
   (a) generating a uniform magnetic field in which said examination region is disposed and thereby aligning nuclear spins in said examination region in a prescribed direction;
   (b) generating a radio-frequency pulse in said examination region for deflecting said nuclear spins from said prescribed direction by a prescribed flip angle of less than 90°;
   (c) after each radio-frequency pulse, generating a read-out gradient having a plurality of sub-pulses of alternating polarity and thereby causing a nuclear magnetic resonance signal in the form of an echo to arise under each subpulse, and reading out at least a portion of said nuclear magnetic resonance signals;
   (d) generating a phase-coding gradient in a direction perpendicular to the direction of said read-out gradient before each read-out gradient and thereby impressing respectively different phase information on each nuclear magnetic resonance signal which is read out;
   (e) repeating steps (b) through (d) M times with the same flip angle, while maintaining a chronological spacing between successive radio-frequency pulses constant and shorter than said spin lattice relaxation time; and
   (f) reconstructing an image of said examination region of said subject from said read-out nuclear magnetic resonance signals.

2. A method as claimed in claim 1 comprising the additional steps of:
   generating a slice-selection gradient in the presence of each radio-frequency pulse, said slice-selection gradient having a direction perpendicular to the direction of said read-out gradient and the direction of said phase-coding gradient; and
   generating a rephasing gradient after each slice-selection gradient for compensating dephasing of said nuclear spins caused by said slice-selection gradient.

3. A method as claimed in claim 1 wherein steps (c) and (d) are further defined by generating said phase-coding gradient during sub-pulses of said read-out gradient of a first polarity and reading out nuclear magnetic resonance signals arising during subpulses of said read-out gradient of a second polarity.

4. A method as claimed in claim 1 comprising the additional step of:

generating a further gradient in the direction of said phase-coding gradient before each radio-frequency pulse for resetting phase information in said phase-coding direction.

5. A method as claimed in claim 4 comprising the additional step of:

generating a pre-phasing pulse in the direction of said read-out gradient between each radio-frequency pulse and a first nuclear magnetic resonance signal following that radio-frequency pulse.

6. A method as claimed in claim 4 comprising the additional step of: generating a pre-phasing pulse in the direction of said read-out gradient before each radio-frequency pulse.

7. A method as claimed in claim 1 comprising the additional steps of:

sampling and digitizing said nuclear magnetic resonance signals to obtain measured values;

entering said measured values into respective rows of a measurement matrix sorted according to the respective phase information in said nuclear magnetic resonance signals; and activating said phase-coding gradient so that measured values corresponding to chronologically successive nuclear magnetic resonance signals are arranged in adjacent rows of said measurement matrix.

8. A method as claimed in claim 1 comprising the additional steps of: sampling and digitizing said nuclear magnetic resonance signals to obtain measured values;

entering said measured values into respective rows of a measurement matrix sorted according to the respective phase information in said nuclear magnetic resonance signals; and activating said phase-coding gradient for dividing measured values corresponding to individual nuclear magnetic resonance signals into groups according to the sequence of the appearance of the nuclear magnetic resonance signals after each radio-frequency pulse, and entering the measured values of each group into successive rows of said measurement matrix.

9. A method as claimed in claim 8 wherein the step of entering said measured values of said nuclear magnetic resonance signals of each group into the measurement matrix is further defined by entering a group, among said groups of measured values containing signals having the highest amplitude into middle rows of said measurement matrix.

10. A method as claimed in claim 9 wherein the step of entering said measured values into said measurement matrix is further defined by entering groups of measured values into said measurement matrix so that groups in adjacent rows of said measurement matrix differ as little as possible in amplitude.

11. A method as claimed in claim 8 wherein the step of entering said measured values corresponding to said nuclear magnetic resonance signals into said measurement matrix is further defined by entering said groups into said measurement matrix in respective rows to obtain a substantially symmetrical distribution of the amplitudes of the nuclear magnetic resonance signals corresponding to the measured values with respect to the middle row of said measurement matrix.

* * * * *